(12) United States Patent
Shimura

(10) Patent No.: US 7,375,547 B2
(45) Date of Patent: May 20, 2008

(54) SEMICONDUCTOR INTEGRATED CIRCUIT AND SEMICONDUCTOR INTEGRATED CIRCUIT MANUFACTURING METHOD

(75) Inventor: Hidekichi Shimura, Machida (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 146 days.

(21) Appl. No.: 11/364,345

(22) Filed: Mar. 1, 2006

(65) Prior Publication Data

US 2006/0202230 A1 Sep. 14, 2006

(30) Foreign Application Priority Data

Mar. 14, 2005 (JP) ............................... 2005-071520

(51) Int. Cl.
*H03K 17/16* (2006.01)
*H03K 19/003* (2006.01)

(52) U.S. Cl. ...................... 326/33; 326/112; 326/119

(58) Field of Classification Search ................ 326/33, 326/119, 121; 327/534
See application file for complete search history.

(56) References Cited

U.S. PATENT DOCUMENTS

| | | | | |
|---|---|---|---|---|
| 5,266,848 A | * | 11/1993 | Nakagome et al. | ............ 326/62 |
| 6,232,793 B1 | * | 5/2001 | Arimoto et al. | ............... 326/34 |
| 6,643,208 B2 | * | 11/2003 | Yamagata et al. | .......... 365/226 |
| 6,831,483 B2 | | 12/2004 | Shimazaki et al. | |

FOREIGN PATENT DOCUMENTS

| | | |
|---|---|---|
| JP | 2001-015692 | 1/2001 |
| JP | 2001-332695 | 11/2001 |
| JP | 2004-207694 | 7/2004 |

OTHER PUBLICATIONS

English Language Abstract of JP 2001-015692, no month 2001.
R. Puri et al., "Pushing ASIC Performance in a Power Envelope," DAC 2003, Jun. 2-6, 2003.
English Language Abstract of JP 2004-207694, no month 2004.
English Language Abstract of JP 2001-332695, no month 2001.

* cited by examiner

*Primary Examiner*—Anh Q. Tran
(74) *Attorney, Agent, or Firm*—Greenblum & Bernstein, P.L.C.

(57) ABSTRACT

An SOI structure semiconductor integrated circuit is disclosed that reduces the number of power supply wires setting substrate potential of a semiconductor element and reduces power consumption. With an SOI structure semiconductor integrated circuit, a first circuit block 51 does not include a critical path and a second circuit block 61 does include a critical path. First power supply wiring 28 supplies a first power supply and second power supply wiring 29 supplies a second power supply of a high-voltage compared to the first power supply. A wiring section 71 (P-channel first substrate power supply wiring and P-channel first power supply wiring) supplies the first power supply as a substrate power supply for P-channel elements of the first circuit block 51 and a source power supply. A wiring section 91 (P-channel second substrate power supply wiring) supplies the first power supply as a substrate power supply for P-channel elements of a second circuit block 61, and a wiring section 81 (P-channel second power supply wiring) supplies the second power supply as a source power supply for P-channel elements of the second circuit block 61.

12 Claims, 16 Drawing Sheets

SEMICONDUCTOR INTEGRATED CIRCUIT AND SEMICONDUCTOR INTEGRATED CIRCUIT MANUFACTURING METHOD

BACKGROUND OF THE INVENTION

1. Field of the Invention

The present invention relates to a semiconductor integrated circuit, and specifically relates to lowering power consumption of a system LSI (Large Scale Integration).

2. Description of Related Art

Technology referred to as dual threshold voltage/power supply voltage (hereinafter described as "dual Vt/Vdd") exists as a design method for lowering LSI power consumption. This technology is designed in the following manner.

With a semiconductor element forming a critical path, the threshold voltage (Vt) is lowered, and the power supply voltage (Vdd) is raised. On the other hand, with a semiconductor element that does not form a critical path, the threshold voltage (Vt) is raised, and the power supply voltage (Vdd) is lowered.

Power consumption at the time of operation of the LSI, as well as sub-threshold leakage current and sub-threshold leakage current when the system LSI is in standby, are reduced using the aforementioned design technology. A specific example for implementing the above content is disclosed in claim 2 of Japanese patent document 1 (Japanese patent Laid-open publication No. 2001-016592), for example. Further, results of reduced power consumption of 60 to 65% when applying the technology disclosed in non-patent publication 1 (David Kung, et al., "Pushing ASIC Performance in a Power Envelope", DAC 2003, Jun. 2, 2003) to actual LSI's are disclosed.

However, there are problems with LSI's of the related art where compatibility cannot be achieved when functions divided between a plurality of LSI's are mounted on a single system LSI. For example, when the process technology becomes 90 nm to 65 nm, it is possible to integrate several hundred million transistors (Tr) on a single chip of a system LSI.

To give an example, conventionally, an audio processing function, a photographic image processing function such as, for example, JPEG (Joint Photographic Experts Group) processing, and an image processing function such as, for example, MPEG (Moving Picture Experts Group) 2 processing have been implemented using individual chips. However, it has become possible to implement these functions on a single system LSI.

Further, semiconductor integrated circuits having an SOI (Silicon On Insulator) structure have been developed and market expansion is anticipated. Currently, dual Vt/Vdd technology is effective technology for semiconductor integrated circuits employing normal silicon substrates, and is also technology exhibiting this value for semiconductor integrated circuits having an SOI structure.

However, in the event that dual Vt/Vdd technology is used in semiconductor integrated circuits having an SOI structure, specific problems exist for SOI structure semiconductor integrated circuits that do not exist in semiconductor integrated circuits employing normal silicon substrates.

For example, with SOI structure semiconductor integrated circuits, substrate potential can be set each P-channel semiconductor element and each N-channel semiconductor element. This will bring about various benefits in the future but also conversely raises a new problem of how to set substrate potential of P-channel semiconductor elements and N-channel semiconductor elements while reducing the amount of power supply wiring.

SUMMARY OF THE INVENTION

It is therefore an object of the present invention to provide a semiconductor integrated circuit, and particularly, an SOI structure semiconductor integrated circuit capable of reducing the number of power supply wiring setting substrate potential of semiconductor elements and capable of reducing power consumption.

According to an aspect of the invention, an SOI (Silicon On Insulator) structure semiconductor integrated circuit with a plurality of circuit blocks composed of P-channel elements and N-channel elements has a first circuit block not including a critical path, a second circuit block including a critical path, first power supply wiring providing a first power supply, second power supply wiring supplying a second power supply of a high voltage compared to the first power supply, P-channel first substrate power supply wiring supplying the first power supply from the first power supply wiring as a substrate power supply for P-channel elements of the first circuit block, P-channel first power supply wiring supplying the first power supply from the first power supply wiring as a source power supply for P-channel elements of the first circuit block, P-channel second substrate power supply wiring supplying the first power supply from the first power supply wiring as a substrate power supply for P-channel elements of the second circuit block and P-channel second power supply wiring supplying the second power supply from the second power supply wiring as a source power supply for P-channel elements of the second circuit block.

According to another aspect of the invention, An SOI (Silicon On Insulator) structure semiconductor integrated circuit with a plurality of circuit blocks composed of P-channel elements and N-channel elements, comprising: a plurality of power supply wires supplying a plurality of power supply voltages to both the substrate power supply and source power supply of the P-channel elements and the substrate power supply and source power supply of the N-channel elements; a first circuit block not including a critical path; and a second circuit block including a critical path, wherein the substrate power supply for P-channel elements of the first circuit block and the P-channel substrate power supply for the second circuit block are supplied from power supply wiring supplying different power supply voltages.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

The following is a detailed description with reference to the drawings of preferred embodiments of the present invention.

First Embodiment

Figure 1:
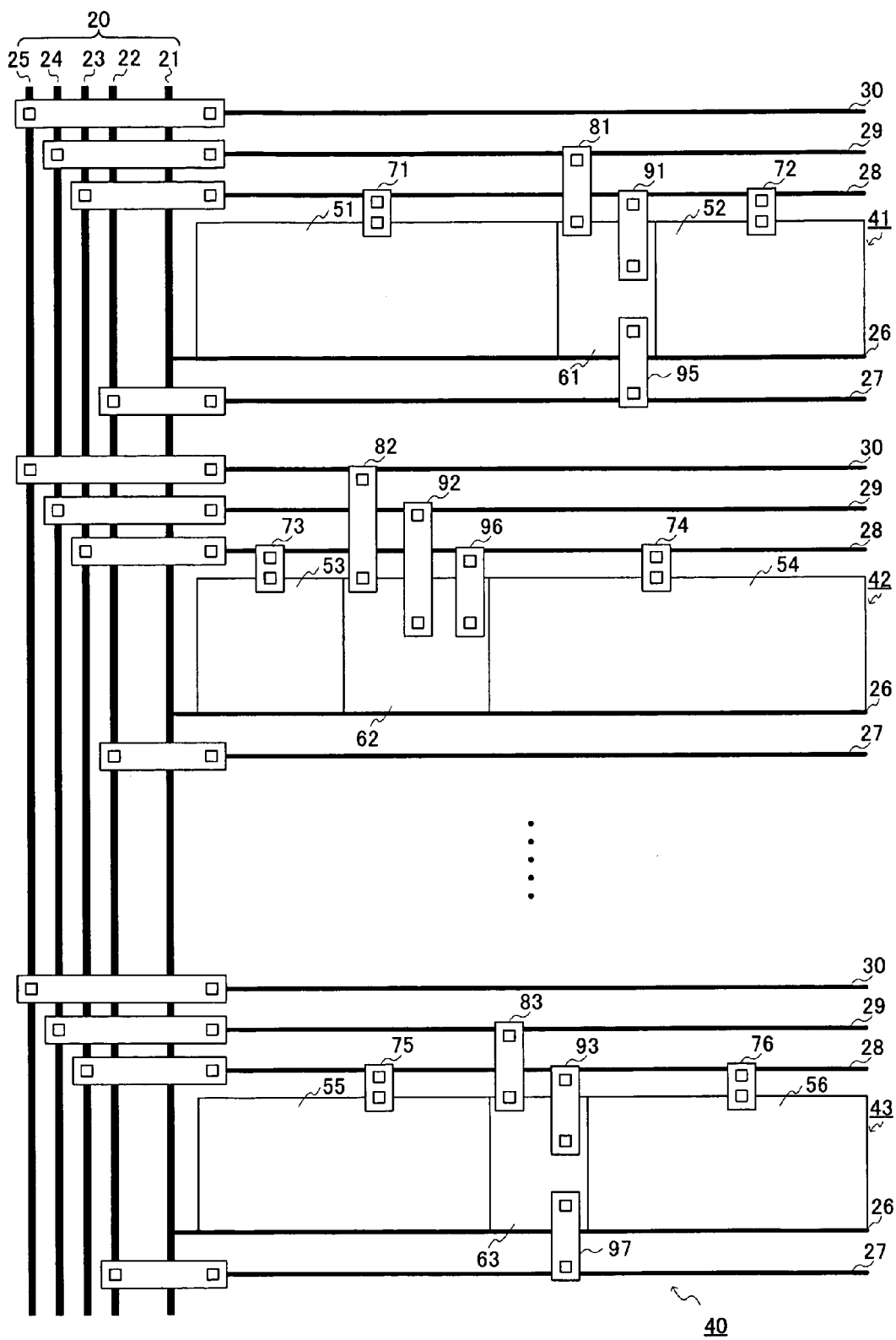
FIG. 1 is a view showing an example arrangement for power supply wiring and basic cell rows of a semiconductor integrated circuit of a first embodiment of the present invention.

FIG. 1 is a view showing an example arrangement for power supply wiring and basic cell rows of a semiconductor integrated circuit of a first embodiment of the present invention. The semiconductor integrated circuit shown in FIG. 1 (partially illustrated) is shown in the diagram with a plurality of power supply wiring 26 to 30 branching from a main power supply line 20, with the plurality of power supply wiring 26 to 30 then being connected to circuit blocks including critical paths and circuit blocks not include critical paths of the plurality of circuit blocks included in the basic cell row 40. A critical path indicates a path where processing is not completed within a permitted time decided by the clock frequency when the clock frequency at which the system LSI operates is decided.

In FIG. 1, an example is shown where the main power supply line 20 is comprised of a reference main power supply line 21, a substrate power supply line 22, a first main power supply line 23, a second main power supply line 24, and a third main power supply line 25. The reference main power supply line 21 supplies a reference power supply of reference power supply voltage values (VSS, ground VSS) to circuit blocks. The substrate power supply line 22 supplies the substrate power supply (VM) to the circuit blocks. The first main power supply line 23 supplies the first power supply (VDDL) of a high voltage (first power supply voltage value) compared to the reference power supply to the circuit blocks. The second main power supply line 24 supplies a second power supply (VDDH1) of a high voltage (second power supply voltage value) compared to the first main power supply line to the circuit blocks. The third main power supply line 25 supplies a third power supply (VDDH2) of a high voltage (third power supply voltage value) compared to the second main power supply line to the circuit blocks. VDDHn is such that n can be made to be a plurality of two or more power supply voltage values but in FIG. 1 a description is given of the case where n=2.

In the wiring arrangement region, reference power supply wiring 26, substrate power supply wiring 27, first power supply wiring 28, second power supply wiring 29, and third power supply wiring 30 branching from the main power supply line 20 extend in a second direction (lateral direction) from the reference main power supply line 21, substrate power supply line 22, first main power supply line 23, second main power supply line 24 and third main power supply line 25 constituting the main power supply line 20. The substrate power supply wiring 27, first power supply wiring 28, second power supply wiring 29 and third power supply wiring 30 are connected to the substrate power supply line 22, first main power supply line 23, second main power supply line 24 and third main power supply line 25, respectively.

The basic cell row 40 is comprised of a plurality of basic cells arranged along a first direction (vertical direction) with respect to the main power supply line 20, with an example composed of basic cells 41, 42, 43 being shown in FIG. 1. The basic cells 41 to 43 are arranged in a plurality of circuit blocks and have first circuit blocks 51 to 56 that do not include critical paths and second circuit blocks 61 to 63 that do include critical paths. Wiring arrangement regions (not shown) are formed between basic cell rows neighboring in the first direction. For example, there may be a region between basic cell 41 and basic cell 42 that is parallel with basic cells 41, 42.

The first circuit blocks 51 to 56 include first semiconductor elements or first logic circuits that do not constitute critical paths (for example, so-called logic circuits such as AND and NAND circuits, etc.). On the other hand, the second circuit blocks 61 to 63 include second semiconductor elements or second logic circuits that do constitute critical paths. Further, there may also be cases where the second circuit blocks 61 to 63 are also equipped with the first semiconductor elements or the first logic circuits. Threshold voltage value of the second semiconductor elements and the second logic circuits are low compared to the threshold voltage values of the first semiconductor elements and the first logic circuits.

Further, wiring sections 71 to 76 are wiring supplying power from the first power supply wiring 28 to the first circuit blocks 51 to 56 of the basic cells 41 to 43. Further, wiring sections 81 to 83 are wiring supplying power from the second power supply wiring 29 or the third power supply wiring 30 to the second circuit blocks 61 to 63 of the basic cells 41 to 43.

For example, in the case of the basic cell 41, the first circuit blocks 51, 52 that do not include critical paths are connected to the first power supply wiring 28 by the wiring sections 71 and 72 and the second circuit block 61 including a critical path is connected to the second power supply wiring 29 by wiring section 81. Further, the reference power supply wiring 26 is connected to all of the circuit blocks. The same also applies for the other basic cells 42 and 43. In this way, the first circuit blocks 51, 52 are supplied with the first power supply (for example, VDDL) from the first power supply wiring 28 and the second circuit block 61 is supplied with the second power supply (for example, VDDH1) from the second power supply wiring 29.

In the above, a description is given of the supply of power to the first circuit blocks 51 to 56 that do not include critical paths of the basic cells 41 to 43 and to the second circuit blocks 61 to 63 that include critical paths. Further, a description as to what extent substrate potential is supplied to the semiconductor elements and logic circuits (for example, logic circuits such as so-called AND, NAND gates etc.) at each respective block is given using FIG. 1. In particular, the first circuit blocks 51 to 56 and the second circuit blocks 61 to 63 are SOI structure CMOS elements, and in the case of a partially-depleted SOI structure, a description is given of the overall arrangement using FIG. 1, with details being described using FIG. 5 and FIG. 6.

In FIG. 1, wiring sections 91, 93 supply the second substrate power supply (here, this is the first power supply supplied by the first power supply wiring 28) to the P-channel elements of the second circuit blocks 61, 63 including critical paths and wiring section 92 supplies the third substrate power supply (here, this is the second power supply supplied by the second power supply wiring 29) to the P-channel element of the second circuit block 62 including a critical path.

Further, wiring sections 95, 97 supply the second substrate power supply (here, this is the substrate power supply supplied by the substrate power supply wiring 27) to the N-channel elements of the second circuit blocks 61, 63 including critical paths and wiring section 96 supplies the third substrate power supply (here, this is the first power supply supplied by the first power supply wiring 28) to the N-channel element of the second circuit block 62 including a critical path.

Figure 2:
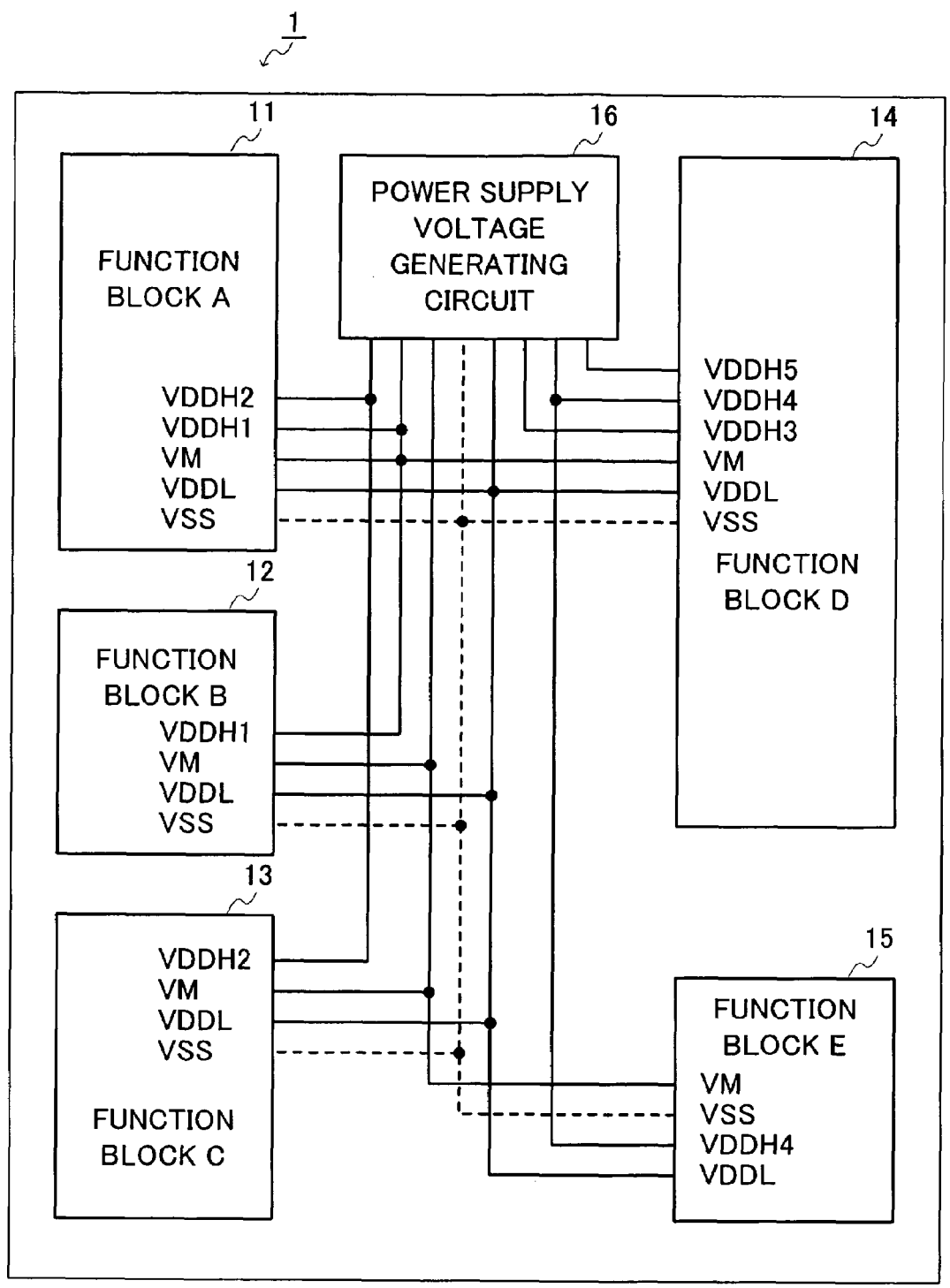
FIG. 2 is a view showing an example of a configuration for a large-scale integrated circuit employing the semiconductor integrated circuit of the aforementioned embodiment.

Next, a description is given of an example of the semiconductor integrated circuit of the present invention applied to a large-scale integrated circuit. FIG. 2 is a view showing an example of a configuration for a large-scale integrated circuit employing the semiconductor integrated circuit of this embodiment. A description is given assuming the example of a large-scale integrated circuit to be a system LSI. To simplify the description, the semiconductor integrated circuit of this embodiment is described using a block diagram where function blocks for logic signal processing functions such as audio processing functions, photographic image processing functions (for example, JPEG processing), and image processing functions (for example, MPEG2 processing) etc. are mounted as function blocks. However, it goes without saying that a substantially similar way of thinking can also be applied to cases where memory function blocks and analog function blocks are mounted on a semiconductor integrated circuit.

The system LSI 1 shown in FIG. 2 is comprised of a plurality of function blocks (function block A11, function block B12, function block C13, function block D14, function block E15) and a power supply voltage generating circuit 16.

The power supply voltage generating circuit 16 has a plurality of power supplies having a plurality of power supply voltage values and supplies power to a plurality of function blocks. The plurality of power supplies have power supply voltage values appropriate for the respective processing powers of the plurality of function blocks and supply power to the respective appropriate function blocks. The plurality of function blocks each have one or a plurality of circuit blocks.

The power supply voltage generating circuit 16 assumes that one or more power supply voltage values (not shown in FIG. 2) are supplied from outside of the system LSI 1. Power supplies having a plurality of power supply voltage values required by the system LSI 1 are then generated based on these one or more supplied power supply voltage values (not shown). In FIG. 2, a description is given where the power supply voltage generating circuit 16 takes the reference power supply (also referred to as VSS or ground VSS), substrate power supply VM, the first power supply (VDDL) that is a high voltage compared to the reference power supply, and second power supply (in FIG. 2, there are five second power supply power supply voltage values (VDDHn, n=1 to 5), the number of power supply voltage values for VDDH in this embodiment (n=5)), as a power supply. The power supply voltage generating circuit 16 supplies power to each function block as shown in the following. Function block A11 is supplied with power supply VDDL, power supply VDDH1, power supply VDDH2 and substrate power supply VM, and reference power supply VSS. The power supply voltage values of power supply VDDH1 and power supply VDDH2 are set higher than the power supply voltage value of the power supply VDDL. Function block B12 is supplied with power supply VDDL, power supply VDDH1 and substrate power supply VM, and reference power supply VSS. The power supply voltage value of power supply VDDH1 is set higher than the power supply voltage value of the power supply VDDL. Function block C13 is supplied with power supply VDDL, power supply VDDH2 and substrate power supply VM, and reference power supply VSS. The power supply voltage value of power supply VDDH2 is set higher than the power supply voltage value of the power supply VDDL. Function block D14 is supplied with power supply VDDL, power supply VDDH3, power supply VDDH4, power supply VDDH5 and substrate power supply VM, and reference power supply VSS. The power supply voltage values of power supply VDDH3, power supply VDDH4 and power supply VDDH5 are set higher than the power supply voltage value of the power supply VDDL. Function block E15 is supplied with power supply VDDL, power supply VDDH4 and substrate power supply VM, and reference power supply VSS. The power supply voltage value of power supply VDDH4 is set higher than the power supply voltage value of the power supply VDDL.

In this way, power supplies of different power supply voltage values are supplied to each function block within a single system LSI1, and within each function block, the supplied power is supplied using the power supply wiring shown in FIG. 1 according to the processing capacity of a circuit block. It is therefore possible to supply power having an appropriate power supply voltage value even in cases where the processing power for each function block is different.

Figure 3:
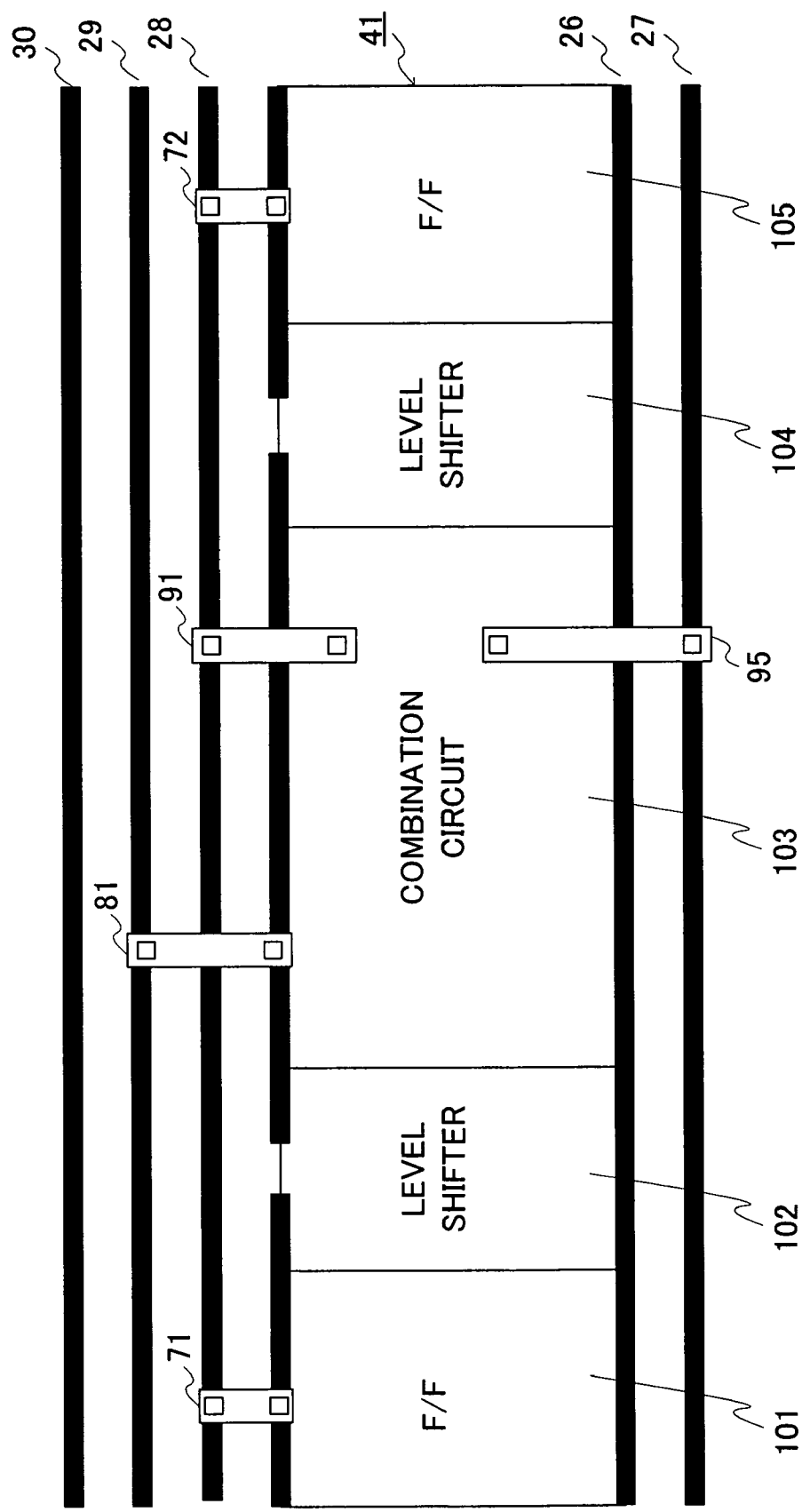
FIG. 3 is a view showing an example of the structure within basic cells and the arrangement of power supply wiring possessed by a semiconductor integrated circuit of this embodiment.

Next, a description is given of the basic cell structure and an example of connection of the power supply wiring and substrate wiring. FIG. 3 is a view showing an example of the structure within basic cells and the arrangement of power supply wiring possessed by a semiconductor integrated circuit of this embodiment. In FIG. 3, numerals that are the same as for FIG. 1 are given the same names, have the same functions, and are therefore not described. FIG. 3 shows a situation where a combination circuit 103 including a critical path is connected to the second power supply wiring 29.

The basic cell 41 is equipped with flip-flops (F/F) 101, 105, level shifters 102, 104, and the combination circuit 103. The level shifters 102, 104 match signal levels between different power supplies. Part of the level shifters 102, 104 and the combination circuit 103 constitute a critical path so as to constitute the circuit block 61 shown in FIG. 1. The wiring section 71 is wiring connecting the first power supply wiring 28, the power supply of the flip-flop 101 and part of the power supply of the level shifter 102. The wiring section 72 is wiring connecting the first power supply wiring 28, the power supply of the flip-flop 105 and part of the power supply of the level shifter 104. Further, the wiring section 81 is wiring connecting the second power supply wiring 29, part of the power supply of the level shifters 102, 104, and the power supply of the combination circuit 103.

The wiring section 91 supplies a P-channel second substrate power supply (here, this is the first power supply) as a substrate power supply for P-channel elements of the combination circuit 103. Further, the wiring section 95 supplies an N-channel second substrate power supply (here, this is the substrate power supply) as a substrate power supply for N-channel elements of the combination circuit 103. The basic cell 42 is the same as the basic cell 41 and is therefore not described.

Figure 4:
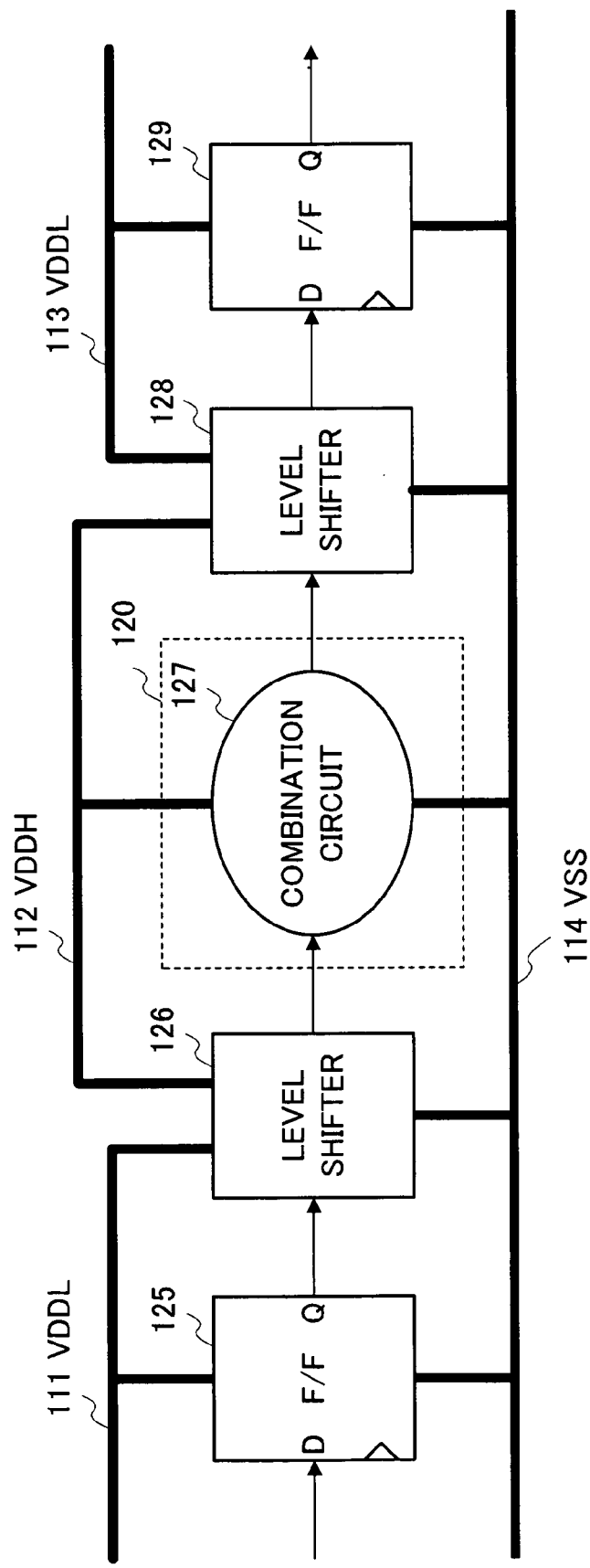
FIG. 4 is a circuit diagram showing an example of circuit blocks having a critical path in the configuration shown in FIG. 3.

FIG. 4 is a circuit diagram showing an example of circuit blocks having a critical path in the configuration shown in FIG. 3. FIG. 4 corresponds to the configuration shown in FIG. 3 and is comprised of first power supply wiring 111, 113, second power supply wiring 112, substrate power supply wiring 114, flip-flops 125, 129, level shifters 126, 128, and a combination circuit 127. A region 120 surrounded by a dotted line indicates a region where the threshold voltage of the semiconductor elements of the structure is lower than the threshold voltage value of the semiconductor elements (circuit blocks) that do not form a critical path. The flow of signals is shown by the arrow (→).

Figure 5:
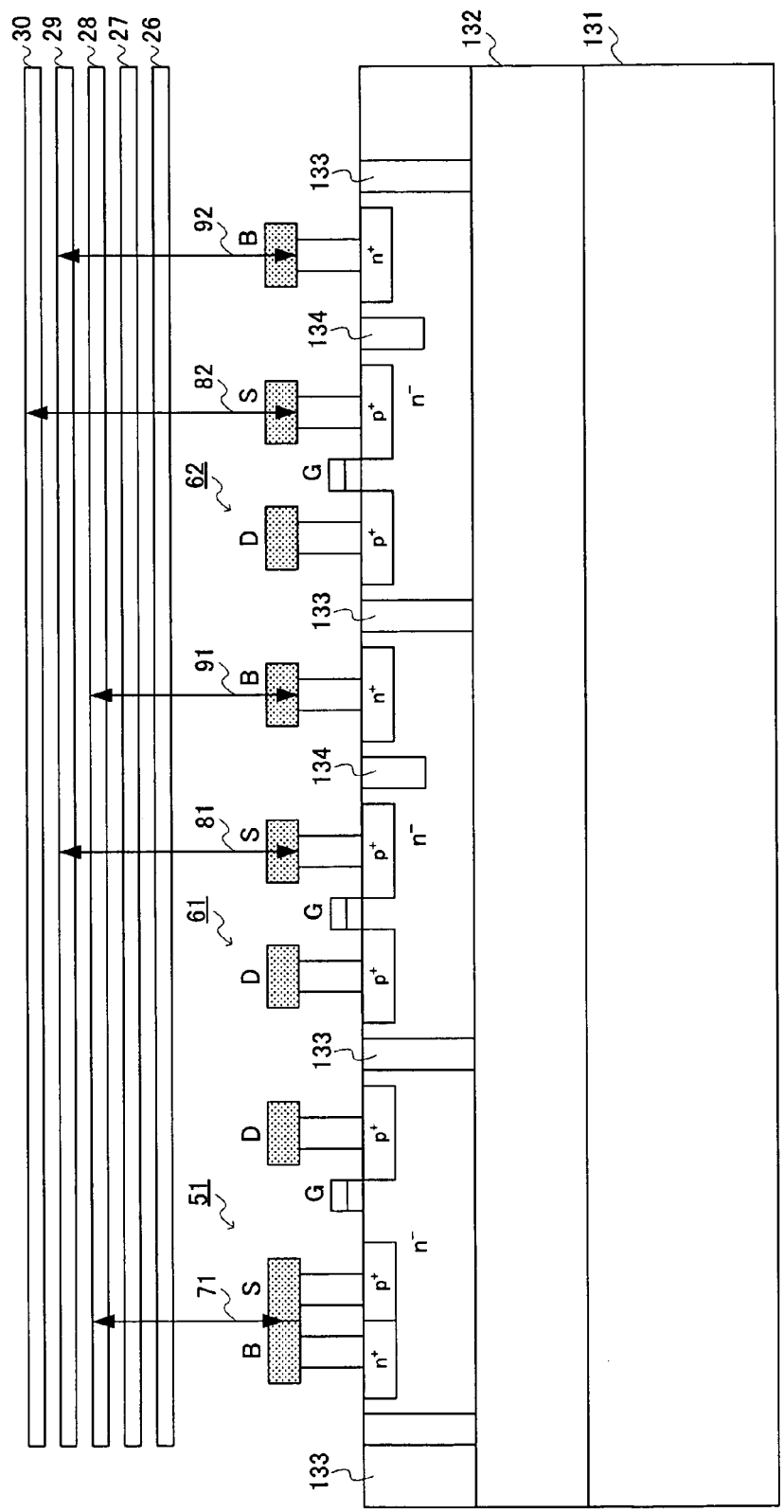
FIG. 5 is a view showing the connection relationship of P-channel first substrate power supply wiring of FIG. 3 and the P-channel semiconductor elements using a cross-sectional view of a partially depleted SOI structure.

FIG. 5 is a view showing the connection relationship of the wiring section 91, P-channel semiconductor element, and power supply wiring of FIG. 3 using a cross-sectional view of a partially depleted SOI structure. Further, FIG. 6 is a view showing the connection relationship of the wiring section 95, N-channel semiconductor element, and power supply wiring of FIG. 3 using a cross-sectional view of a partially depleted SOI structure.

Figure 6:
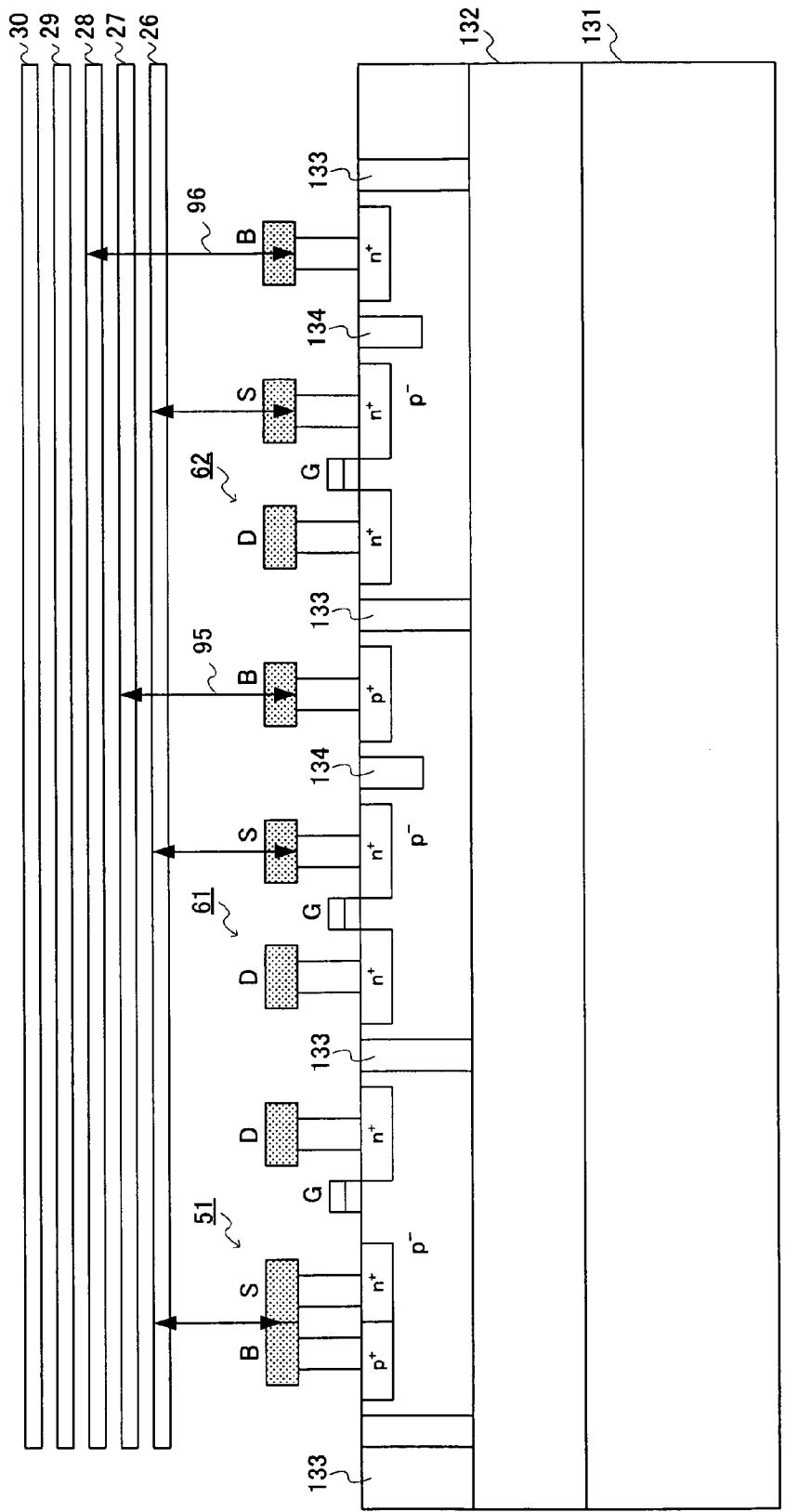
FIG. 6 is a view showing the connection relationship of N-channel first substrate power supply wiring of FIG. 3 and the N-channel semiconductor element using a cross-sectional view of a partially depleted SOI structure.

In FIG. 5 and FIG. 6, numerals that are the same as for FIG. 1 are given the same names, have the same functions, and are therefore not described. Further, numeral 131 indicates a silicon support substrate, numeral 132 indicates an embedded oxide layer, numeral 133 indicates complete trench isolation, and numeral 134 indicates partial trench isolation. The P-channel elements shown in FIG. 5 and the N-channel elements shown in FIG. 6 correspond, from the left, to the first circuit block 51 and the second circuit blocks 61, 62. In FIG. 5 and FIG. 6, the second circuit blocks 61, 62 are shown lined up to simplify the drawing. The second circuit block 62 shows an example where the power supply voltage is different to that for the second circuit block 61. Further, in FIG. 5 and FIG. 6, the arrows indicate the connection relationship between each of the electrodes and the power supply wiring, and numerals applied to the arrows are numerals corresponding to those given to the wiring sections of FIG. 1. In FIG. 1, numeral 26 is used because the reference power supply wiring 26 adopts a configuration where wiring sections are not necessary.

In FIG. 5, wiring sections 91 and 92 connect the substrate potentials of the P-channel semiconductor elements to power supply wiring of appropriate potentials. Further, in FIG. 6, wiring sections 95 and 96 connect the substrate potentials of the N-channel semiconductor elements to power supply wiring of appropriate potentials. It is possible to put the substrate potentials of the P-channel semiconductor elements and the N-channel semiconductor elements to appropriate potentials by connecting the wiring sections 91, 92 and the wiring sections 95, 96 to power supply wiring of respectively appropriate potentials. Further, it is possible to control the threshold voltages of the P-channel semiconductor elements and the N-channel semiconductor elements of the circuit blocks forming critical paths by putting the substrate potentials to appropriate values and utilizing substrate bias effects.

In the above, a description is given of the outline of FIG. 5 and FIG. 6. Next, a description is given of how FIG. 1, FIG. 5 and FIG. 6 correlate. The connection conditions shown in FIG. 5 and FIG. 6 are an example, and the connection conditions are by no means limited to that described in the following.

First, a description is given of an SOI structure semiconductor integrated circuit. The first circuit blocks 51 to 56 and the second circuit blocks 61 to 63 are composed of P-channel elements and N-channel elements.

At each circuit block, a substrate power supply and source power supply are supplied to the P-channel elements and a substrate power supply and reference power supply are supplied to the N-channel elements, from each power supply wiring.

A description is now given of the first circuit block 51 as an example of a circuit block that does not include a critical path. Because the first circuit block 51 does not include a critical path, the same power supply voltage is supplied for the substrate power supply and the source power supply for the P-channel elements. The wiring section 71 therefore supplies the first power supply from the first power supply wiring 28 as both the substrate power supply for the P-channel elements and the source power supply for the P-channel elements. The wiring section 71 plays the role of the P-channel first substrate power supply wiring supplying the substrate power supply for the P-channel elements and the P-channel first power supply wiring supplying the source power supply for the P-channel elements.

Similarly, the first circuit block 51 is such that the same power supply voltage is supplied as the substrate power supply for the N-channel elements and the reference power supply for the N-channel elements. The reference power supply wiring 26 therefore supplies the reference power supply as both the substrate power supply and reference power supply for the N-channel elements. The reference power supply wiring 26 plays the role of the N-channel first substrate power supply wiring supplying the substrate power supply for the N-channel elements and the N-channel first reference power supply wiring supplying the reference power supply for the N-channel elements.

In FIG. 1 and FIG. 3, the substrate power supply for the N-channel elements and the reference power supply for the N-channel elements are connected to the reference power supply wiring 26 as a result of layout design even if specific wiring is not implemented. Therefore, in FIG. 6, the substrate power supply for the N-channel elements and the reference power supply for the N-channel elements are both wiring for the reference power supply wiring 26 and are therefore not assigned numerals.

Next, a description is now given of the second circuit block 61 as an example of a circuit block that does include a critical path. The second circuit block 61 is supplied with different power supply voltages by the substrate power supply and the source power supply for the P-channel elements. The wiring section 91 therefore supplies the first power supply from the first power supply wiring 28 as the substrate power supply for the P-channel elements. Further, the wiring section 81 supplies the second power supply from the second power supply wiring 29 as the source power supply for the P-channel elements. The wiring section 91 plays the role of P-channel second substrate power supply wiring supplying the substrate power supply for the P-channel elements. The wiring section 81 plays the role of P-channel second power supply wiring supplying the source power supply for the P-channel elements.

Similarly, the second circuit block 61 is supplied with different power supply voltages by the substrate power supply and the reference power supply for the N-channel elements. The wiring section 95 therefore supplies the substrate power supply from the substrate power supply wiring 27 as the substrate power supply for the N-channel elements. The reference power supply wiring 26 supplies the reference power supply as the source power supply for the N-channel elements. The wiring section 95 plays the role of N-channel second substrate power supply wiring supplying the substrate power supply for the N-channel elements. The reference power supply wiring 26 plays the role of N-channel second reference power supply wiring supplying the reference power supply for the N-channel elements.

Next, a description is now given of the third circuit block 62 as an example of a circuit block that does include a critical path. This circuit block is a circuit block including a critical path and is a type of second circuit block and is a block requiring higher speed than the second block that is referred to as the third circuit block for convenience.

The third circuit block 62 is supplied with different power supply voltages for the substrate power supply and the source power supply for the P-channel elements, and is a circuit block operating at a higher speed than the second circuit block 61. The wiring section 92 therefore supplies the second power supply from the second power supply wiring 29 as the substrate power supply for the P-channel elements. Further, the wiring section 82 supplies the second power supply from the third power supply wiring 30 as the source power supply for the P-channel elements. The wiring section 92 plays the role of P-channel third substrate power supply wiring supplying the substrate power supply for the P-channel elements. The wiring section 82 plays the role of P-channel third power supply wiring supplying the source power supply for the P-channel elements. In FIG. 1 and FIG. 5, an example is shown where the wiring section 92 is connected to the second power supply wiring 29 but the wiring section 92 may also be connected to the first power supply wiring 28, as with the second circuit block 61. In this case, a bias more in a forward direction is applied and the absolute value of the threshold value for the P-channel elements becomes smaller.

Similarly, the third circuit block 62 is supplied with different power supply voltages for the substrate power supply and the reference power supply for the N-channel elements. The wiring section 96 therefore supplies the reference power supply from the first power supply wiring 28 as the substrate power supply for the N-channel elements. The reference power supply wiring 26 supplies the reference power supply as the source power supply for the N-channel elements. The wiring section 96 plays the role of N-channel third substrate power supply wiring supplying the substrate power supply for the N-channel elements. The reference power supply wiring 26 plays the role of N-channel third reference power supply wiring supplying the reference power supply for the N-channel elements.

For example, the absolute value for the threshold voltage of a P-channel semiconductor element when the source power supply is connected to the second power supply wiring 29 and the substrate potential of the P-channel semiconductor element is connected to the first power supply wiring 28 as with a P-channel semiconductor element for a circuit block forming a critical path is small compared with the threshold voltage of a P-channel semiconductor element when the source power supply is connected to the first power supply wiring 28 and the substrate potential of the P-channel semiconductor element is also connected to the first power supply wiring 28 as with a P-channel semiconductor element for a circuit block that does not form a critical path.

Further, it is possible to make the absolute value for the threshold voltages of the P-channel semiconductor elements smaller by connecting the source power supply of the P-channel semiconductor element to the third power supply wiring 30 and connecting the substrate potential of the P-channel semiconductor element to the first power supply wiring 28.

Further, the threshold voltage of a N-channel semiconductor element when the source power supply is connected to the reference power supply wiring 26 and the substrate potential of the N-channel semiconductor element is connected to the substrate power supply wiring 27 as with a N-channel semiconductor element for a circuit block forming a critical path is small compared with the threshold voltage of a N-channel semiconductor element when the source power supply is connected to the reference power supply wiring 26 and the substrate potential of the N-channel semiconductor element is also connected to the reference power supply wiring 26 as with a N-channel semiconductor element for a circuit block that does not form a critical path.

Further, it is possible to make the value for the threshold voltages of the N-channel semiconductor elements smaller by connecting the source power supply of the N-channel semiconductor element to the reference power supply wiring 26 and connecting the substrate potential of the N-channel semiconductor element to the first power supply wiring 28.

A description is given of an example where a substrate potential for an N-channel semiconductor element is connected to the first power supply wiring 28 but it is also possible to provide another substrate power supply wiring of a high potential from the substrate power supply wiring 27 and connect to this.

With a circuit block forming a critical path, at the time of operation, a forward bias is applied to the P-channel semiconductor elements and the N-channel semiconductor elements and the absolute value of the threshold value is made small using the method described above. On the other hand, at the time of standby, it is possible to reduce the sub-threshold leakage current of the N-channel semiconductor elements by stopping the application of forward bias applied to the P-channel semiconductor elements and N-channel semiconductor elements.

This can be implemented at the time of standby by making the power supply potentials of the source power supply for the P-channel elements of the second circuit block and the source power supply for the P-channel elements of the third circuit block the same as the power supply voltage of the source power supply of the P-channel elements of the first circuit block, and by setting the power supply potential of the N-channel second substrate power supply and the N-channel third substrate power supply to the power supply voltage of the reference power supply constituted by the power supply voltage of the N-channel first substrate power supply.

As shown above, at the partially depleted SOI, the source power supply and the substrate power supply can be applied individually to both the P-channel semiconductor elements and the N-channel semiconductor elements. It is therefore possible to change the threshold voltage of the P-channel semiconductor elements and N-channel semiconductor elements respectively according to the extent to which a substrate bias voltage is applied to the source power supplies of the P-channel semiconductor elements and the N-channel semiconductor elements respectively.

As described up to this point, if the power supply wiring deciding the respective potentials is wired effectively, it is possible to reduce the respective operating currents and leakage currents at the time of operation and at the time of standby by utilizing the characteristics of the P-channel semiconductor elements and the N-channel semiconductor elements constructed using this partially depleted SOI.

In FIG. 5, the semiconductor elements and logic circuits of the circuit blocks for the first circuit block, second circuit block and third circuit block of FIG. 1 are typified by semiconductor elements or logic circuits and the P-channel semiconductor elements and N-channel semiconductor elements are shown respectively as single semiconductor elements. However, the circuit blocks for the first circuit block, second circuit block, and third circuit block are by no means limited to semiconductor elements or logic circuits. By constructing a plurality of semiconductor elements or logic circuits within these circuit blocks using partial trench isolation, even if the circuit blocks are constructed from a plurality of semiconductor elements or logic circuits, it is possible for the same substrate potential to be applied to P-channel and N-channel sections of the semiconductor elements or logic circuits of the circuit blocks of the first circuit block, second circuit block, and third circuit block. This means that wiring for setting substrate potential can be substantially reduced.

By adopting the circuit configuration shown in FIG. 1 to FIG. 5, design is such that at semiconductor elements or logic circuits forming critical paths, the threshold voltage (Vt) is lowered and the power supply voltage (Vdd) is raised. On the other hand, with semiconductor elements and logic circuits that do not form critical paths, the threshold voltage (Vt) is raised and the power supply voltage (Vdd) is lowered. In doing this, dual Vt/Vdd technological concepts can be effectively implemented for partially depleted SOI structures.

The first circuit block that does not form a critical path is connected to the first power supply wiring and is supplied with the first power supply (VDDL). On the other hand, a second circuit block forming a critical path is connected to the second power supply wiring and is supplied with the second power supply (VDDHn). The second power supply is such that one or more power supplies VDDHn (In this embodiment, n is taken to be one value from 1 to 5) having power supply voltage values appropriate for the respective processing circuit blocks (function blocks) coming from a plurality of power supplies generated by the power supply voltage generating circuit are provided respectively to the plurality of circuit blocks. However, this power supply voltage value has a power supply voltage value higher than the power supply voltage value of the same power supply as supplied to the circuit blocks that do not form critical paths. It is therefore possible to implement low power consumption for the semiconductor integrated circuit of this embodiment because power supplies VDDHn having power supply voltage values appropriate for the respective processing powers of the plurality of circuit blocks including critical paths are provided.

A description of the case where a plurality of power supplies are supplied from outside is omitted here but the basic content is the same as the case where the power supplies are generated by a power supply voltage generating circuit.

Second Embodiment

In a second embodiment, a method is described in the following for further improving sub-threshold leakage current. It is possible to reduce power consumption at the time of operation and both sub-threshold leakage current and sub-threshold leakage current during standby of the semiconductor integrated circuit while maintaining functionality of a semiconductor circuit having various function blocks by developing the dual Vt/Vdd technological concepts. The dual Vt/Vdd technological concepts are described in the first embodiment and are therefore omitted here.

A method is described in the following for improving sub-threshold leakage current during standby. Here, a description is given taking the circuit diagram of the circuit block having a critical path shown in FIG. 4 as an example.

Figure 7:
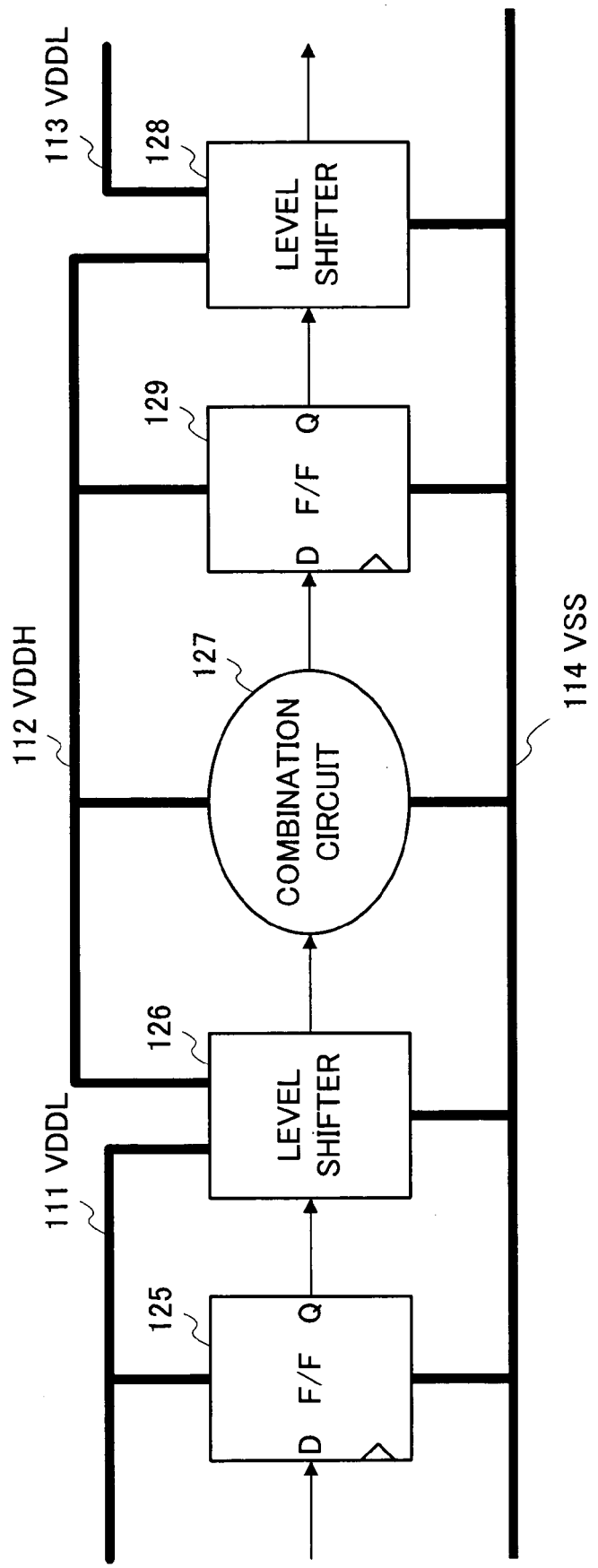
FIG. 7 is a circuit diagram showing a modified example of the arrangement (positional relationship) of the circuit blocks shown in FIG. 4.
Figure 8:
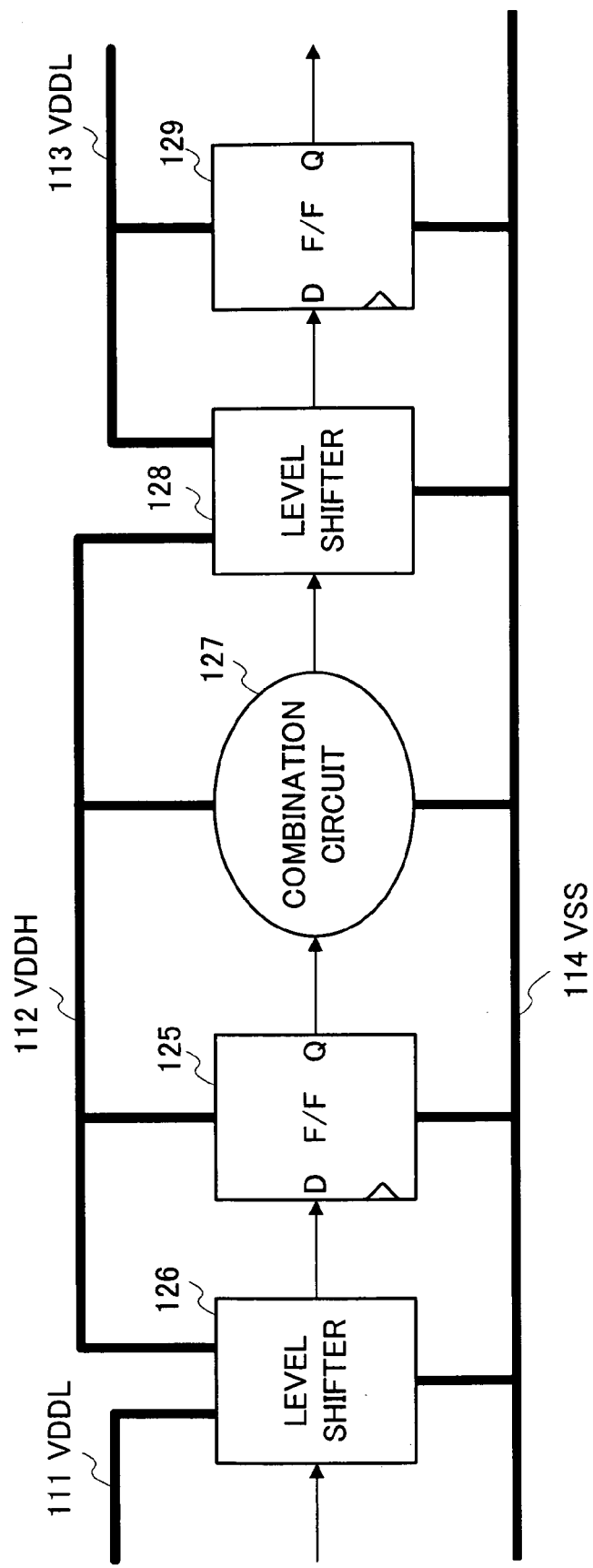
FIG. 8 is a circuit diagram showing a further modified example of the arrangement (positional relationship) of the circuit blocks shown in FIG. 4.
Figure 9:
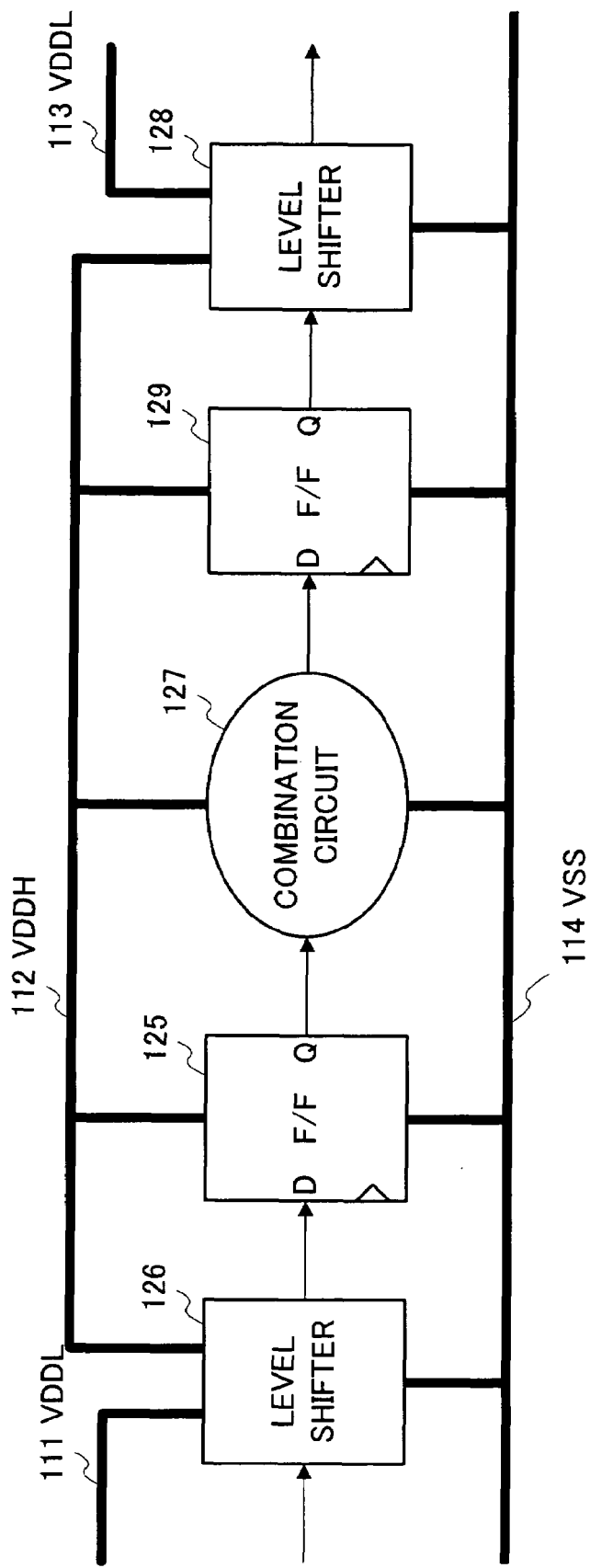
FIG. 9 is a circuit diagram showing another modified example of the arrangement (positional relationship) of the circuit blocks shown in FIG. 4.

First, the positional relationship of the two flip-flops 125, 129, the two level shifters 126, 128, and the combination circuit 127 is examined. FIG. 7 to FIG. 9 are circuit diagrams of changes in the arrangement (positional relationship) of the circuit blocks shown in FIG. 4. Parts with the same numerals as in FIG. 4 have different positional relationships and connection relationships but have the same names and functions, and are therefore not described. As shown in FIG. 4 and FIG. 7 to FIG. 9, four cases are considered for the positional relationship of the two flip-flops 125, 129, the two level shifters 126, 128, and the combination circuit 127. In FIG. 4, a region where the threshold voltage of the semiconductor elements is lower than the threshold voltage of the semiconductor elements that do not form a critical path is shown using a dotted line but is not shown in FIG. 7 to FIG. 9.

Next, values for the threshold voltages of the semiconductor elements are examined. The positional relationship of the two flip-flops 125, 129, the two level shifters 126, 128, and the combination circuit 127 for the case shown in FIG. 4 is considered as an example. In FIG. 10 to FIG. 13, with the circuit block structure of FIG. 4, the region where the threshold voltages of the semiconductor elements are low is shown using a dotted line. The five cases of FIG. 4, FIG. 10, FIG. 11, FIG. 12 and FIG. 13 are considered as to which region should be made the region where the threshold voltage for the semiconductor elements is made low. Therefore, as shown in FIG. 4 and FIG. 7 to FIG. 13, a total of 20 cases can be considered using the positional relationship of the two flip-flops 125, 129, the two level shifters 126, 128, and the combination circuit 127 and by considering which region to make the region where the threshold voltages of the semiconductor elements are low.

There is no particular necessity to pick a particular configuration of the total of twenty configurations of the positional relationships and the threshold voltages with the restriction that timing conditions are satisfied. However, in the event that a power supply voltage (second power supply, VDDH) is not supplied to the second power supply wiring 112 of FIG. 4, when it is intended to further improve the sub-threshold leakage current during standby by not applying the power supply voltage to the combination circuit 127, the configurations matching the conditions are limited. In the event that the power supply voltage is not supplied to the second power supply wiring 112, it is preferable for the two flip-flops 125, 129 to maintain the state from immediately before. Therefore, a positional relationship for the circuit blocks such that a power supply voltage is no longer supplied to the two flip-flops 125, 129 when the power supply voltage is not supplied to the second power supply wiring 112, i.e. FIG. 7, FIG. 8, FIG. 9, is excluded.

Figure 10:
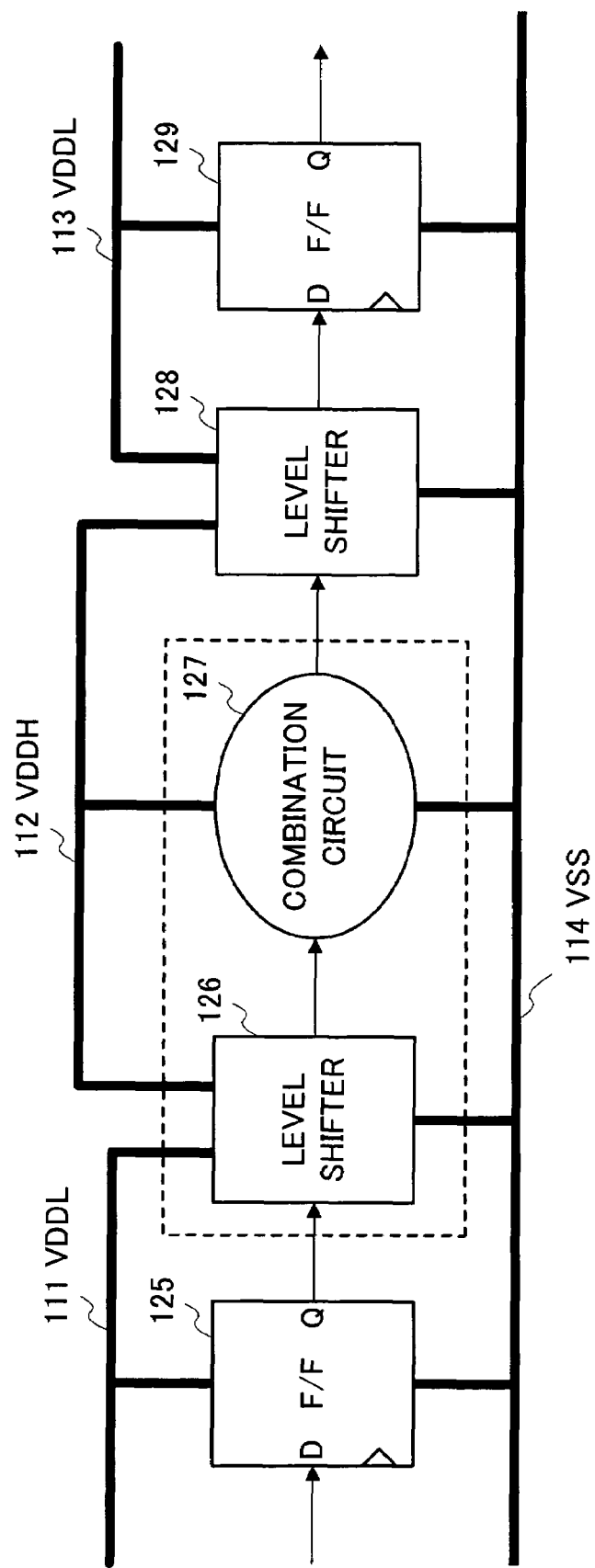
FIG. 10 is a view showing an example of a region where semiconductor element threshold voltage is made low for the circuit blocks of FIG. 4.
Figure 11:
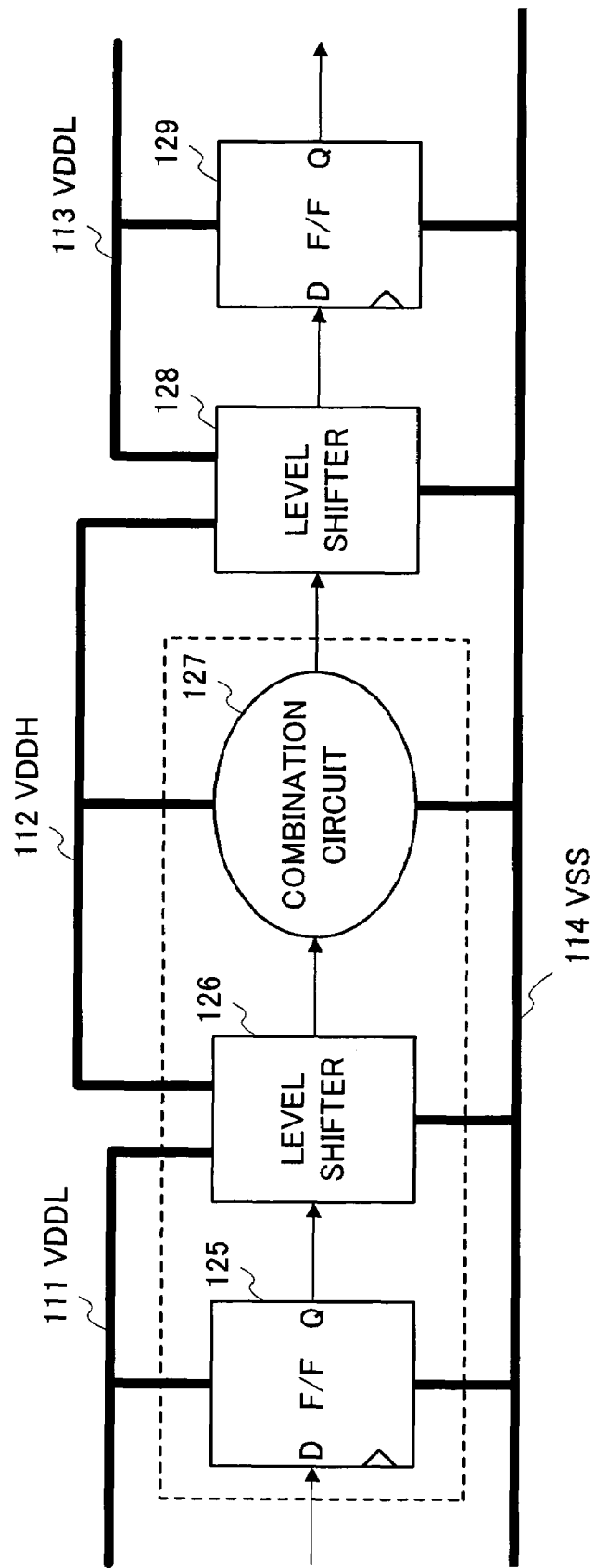
FIG. 11 is a view showing a further example of a region where semiconductor element threshold voltage is made low for the circuit blocks of FIG. 4.
Figure 12:
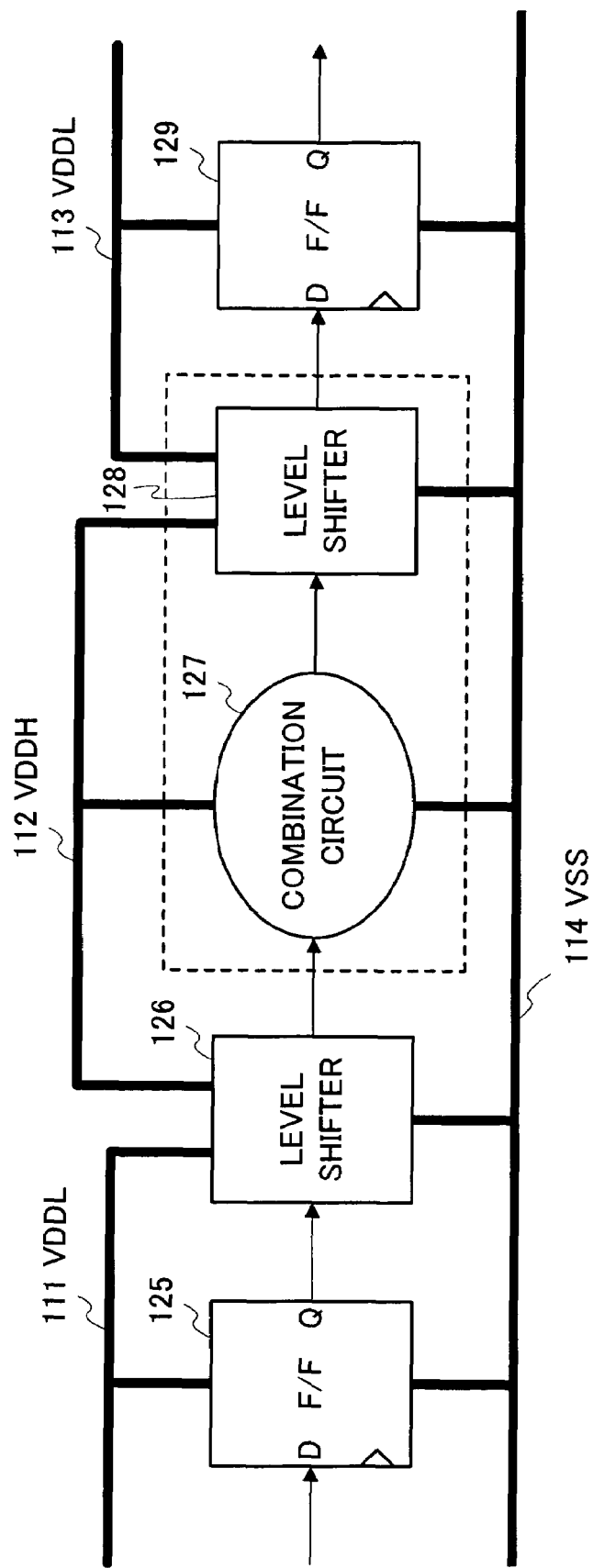
FIG. 12 is a view showing another example of a region where semiconductor element threshold voltage is made low for the circuit blocks of FIG. 4.
Figure 13:
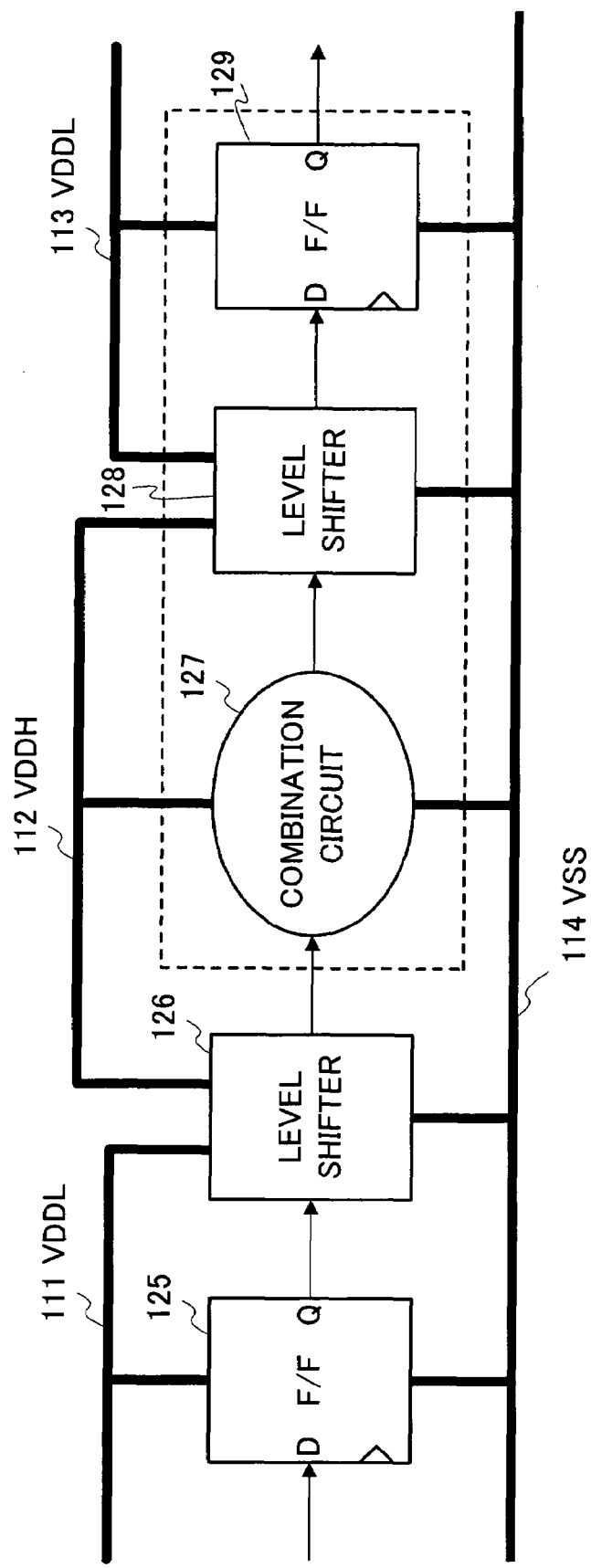
FIG. 13 is a view showing another example of a region where semiconductor element threshold voltage is made low for the circuit blocks of FIG. 4.

Further, at the remaining FIG. 4 and FIG. 10 to FIG. 13, when the threshold voltage of the two flip-flops 125, 129 supplied with the second power supply (VDDH) is made low, this does not match with the purpose of further improving sub-threshold leakage current during standby and FIG. 11 and FIG. 13 are therefore also excluded.

Therefore, in the event that it is intended to further improve the sub-threshold leakage current during standby by not applying a power supply voltage to the combination circuit 127 when a power supply voltage is not supplied to the second power supply wiring 112, the configuration for the positional relationship of the two flip-flops 125, 129, the two level shifters 126, 128, and the combination circuit 127 and which region to make the region where the threshold voltage of the semiconductor elements is low is limited to FIG. 4, FIG. 10 and FIG. 12. Of these, from the points (1) the reduction of sub-threshold leakage current during standby, and (2) the ability to maintain the immediately previous state at the flip-flops 125, 129 even in cases where a power supply voltage is not supplied to the second power supply wiring 112 , the configuration of FIG. 4 is the most desirable.

Figure 14:
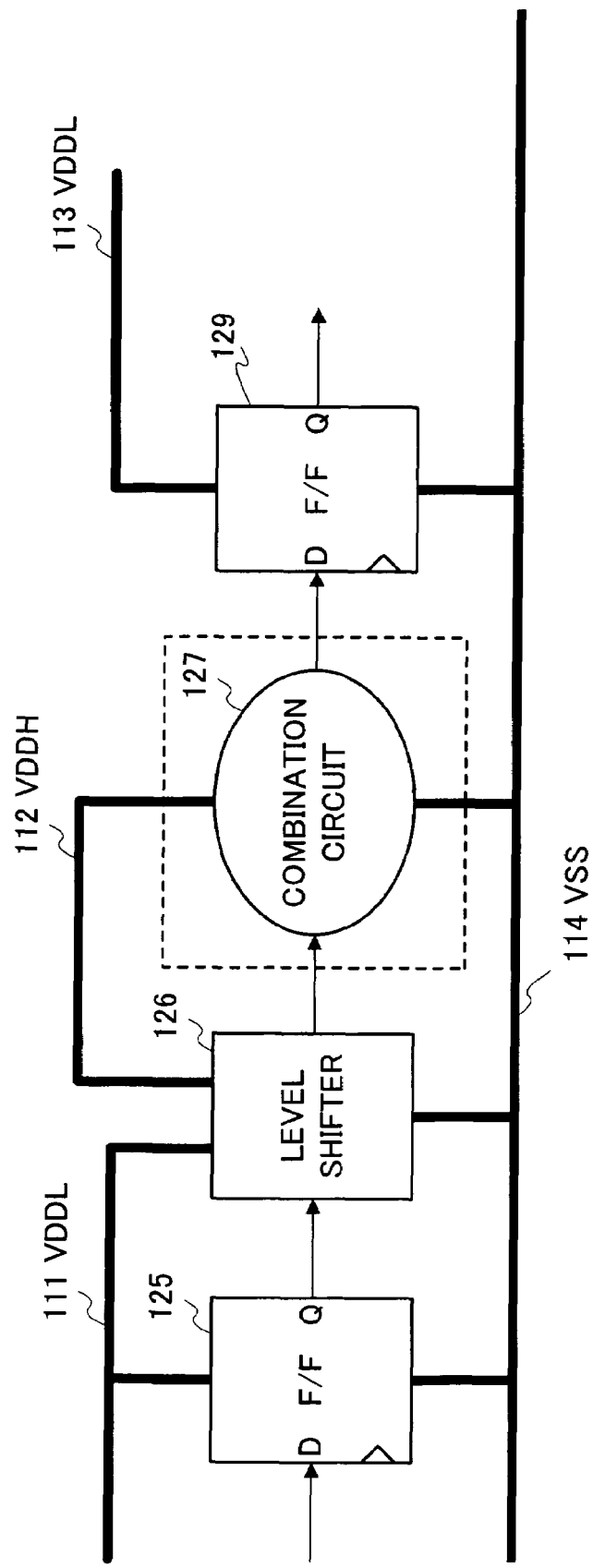
FIG. 14 is a view showing another example of a region where semiconductor element threshold voltage is made low for the circuit blocks of FIG. 4.

Further, in FIG. 4 and FIG. 10 to FIG. 13, a description is given of the case where the level shifter 128 is present after the combination circuit 127 to provide ease of description for the positional relationship of the two flip-flops 125, 129, the two level shifters 126, 128, and the combination circuit 127, but the level shifter 128 is not always essential. The level shifter is necessary in cases where a signal is transmitted from a circuit block of a lower power supply voltage to a circuit block of high power supply voltage such as from the first circuit block to the second circuit block but is not necessary in cases where the signal is transmitted from a circuit block with a high power supply voltage to a circuit block with a lower power supply voltage such as from the second circuit block to the first circuit block. FIG. 14 is a view showing another example of a region where semiconductor element threshold voltage is made low for the circuit blocks of FIG. 4, and in particular shows an example of a configuration where the level shifter 128 is not provided.

Figure 15:
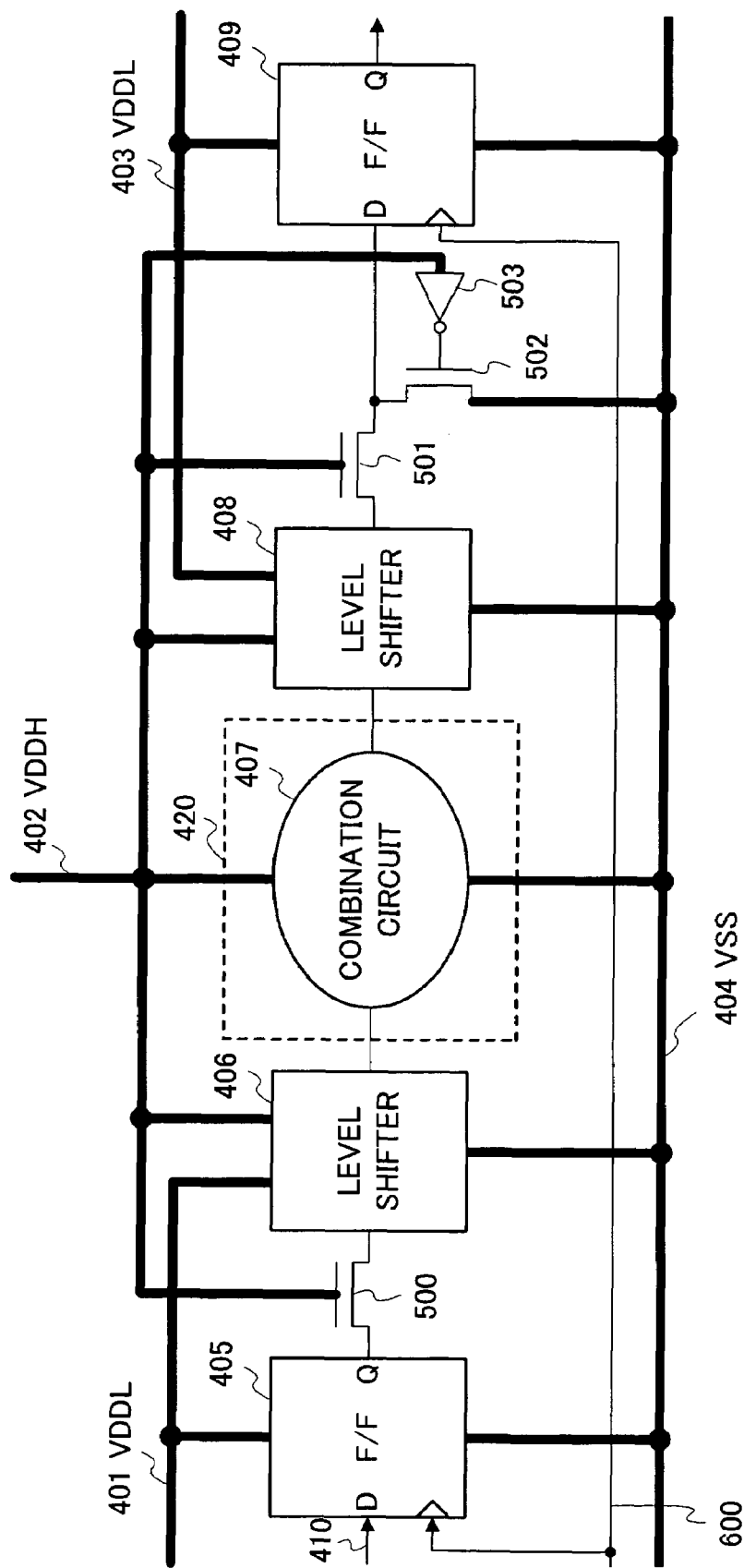
FIG. 15 is a diagram of a circuit for improving sub-threshold leakage current for the circuit block configuration of FIG. 4.

FIG. 15 is an example of a diagram of a circuit for improving sub-threshold leakage current for the circuit block configuration of FIG. 4. A specific circuit diagram is shown for further improving the sub-threshold leakage current at the time of standby by not applying a power supply voltage to the combination circuit when a power supply voltage is not supplied to the second power supply wiring.

In FIG. 15, the first power supply wiring 401, 403, second power supply wiring 402, and reference power supply wiring 404 are given the same names and have the same functions as for FIG. 1. The circuit block of FIG. 15 is equipped with flip-flops 405, 409, level shifters 406, 408, a combination circuit 407, transfer gates 500, 501, 502, an inverter 503, and a system clock 600. The region with the numeral 420 surrounded by a dotted line indicates a region where threshold voltages of semiconductor elements of the structure are lower than threshold voltages of semiconductor elements constituting circuit blocks that do not form critical paths.

The circuit block of FIG. 15 has a transfer gate 500 between the flip-flop 405 and the level shifter 406. Further, a transfer gate 501 is provided between the flip-flop 409 and the level shifter 408. Moreover, a transfer gate 502 is provided between the flip-flop 409, the transfer gate 501 and the reference power supply wiring 404. An inverted potential of a second power supply (VDDH) potential is applied to the transfer gate 500 and the transfer gate 501, and a potential that is the potential of the second power supply (VDDH) is applied to the transfer gate 502. With this configuration, it is possible to improve sub-threshold leakage current during standby by setting the power supply voltage of the combination circuit 407 to ground potential when the power supply voltage is not supplied to the second power supply wiring 402, i.e. when the potential of the power supply voltage of the second power supply wiring 402 is set to ground potential (VSS).

Further, in FIG. 15, first power supplies (VDDL) 401, 403 are applied to the flip-flop 405 and the flip-flop 409. It is therefore possible to maintain the state from immediately before in the standby state even if the second power supply (VDDH) 402 is cut. When returning from a standby state so that a power supply voltage is applied to the second power supply wiring 402, it is possible to return to the operating state immediately prior to the standby state.

Further, in FIG. 15, in the event that a certain function block of a plurality of function blocks is set to a standby state, the system clock 600 supplied to the certain function block is stopped, and the voltage of the second power supply wiring 402 provided to the certain function block is cut so as to set the certain function block to ground potential. On the other hand, in the event that a certain function block of a plurality of function blocks returns from a standby state, the power supply voltage of the second power supply wiring 402 supplied to the certain function block is set to the power supply potential (voltage value of the second power supply) and the system clock 600 supplied to the certain function block is re-applied. It is therefore possible to carry out design based on dual Vt/Vdd technological concepts by setting the certain function block of the plurality of function blocks to a standby state using the aforementioned procedure and returning from the standby state.

In this way, it is possible to prevent the substantial flow of sub-threshold leakage current by cutting the power supply supplied to a combination circuit for which the threshold voltage is made low during standby. When standby is returned from, the state before standby is held in the first flip-flop 405 and the second flip-flop 409 to which the first power supply (VDDL) is applied, and it is therefore possible to swiftly return to an operating state.

Further, even in the event that functions (circuit blocks) with different processing power for each respective function block are mounted, it is possible to design power supply voltage values (power supply voltage value for second power supply) and threshold values for semiconductor elements (threshold voltage values) in such a manner as to improve a path delay value for a circuit block having a critical path up to a required path delay value derived from the operating frequency. It is therefore possible to reduce the power consumption and sub-threshold leakage current at the time of operation of the semiconductor integrated circuit and the sub-threshold leakage current during standby of the semiconductor integrated circuit.

Further, it is possible to further reduce sub-threshold leakage current during standby of the semiconductor integrated circuit by cutting the second power supply (VDDH) 402 supplied to the circuit block and setting this value to ground potential (VSS) during standby when a clock is not supplied to the circuit block. This is because, as the threshold voltage is low, it is possible to halt the supply of the power supply to the combination circuit where substantial sub-threshold leakage current flows from the semiconductor elements having normal threshold voltages while maintaining the states before at the first flip-flops and second flip-flops of the plurality of circuits having critical paths.

As described above, it is possible to reduce the leakage current at the time of standby by setting the power supply voltage of the power supply wiring supplying a source power supply for the P-channel elements of the circuit blocks other than the first circuit block to ground potential.

However, even with methods other than this, it is also possible to reduce leakage current at the time of standby by making the power supply voltage of the P-channel substrate power supply for other than the first circuit block and the power supply voltage of the P-channel source power supply equal and making the power supply voltage for the N-channel substrate power supply for other than the first circuit block and the power supply voltage of the N-channel source power supply equal so as to make the threshold values of the P-channel elements and N-channel elements other than for the first circuit block equal to the threshold values of the P-channel elements and N-channel elements of the first circuit block.

Embodiments relating to these can easily be surmised from the first embodiment and the second embodiment and description thereof here is omitted.

Third Embodiment

Figure 16:
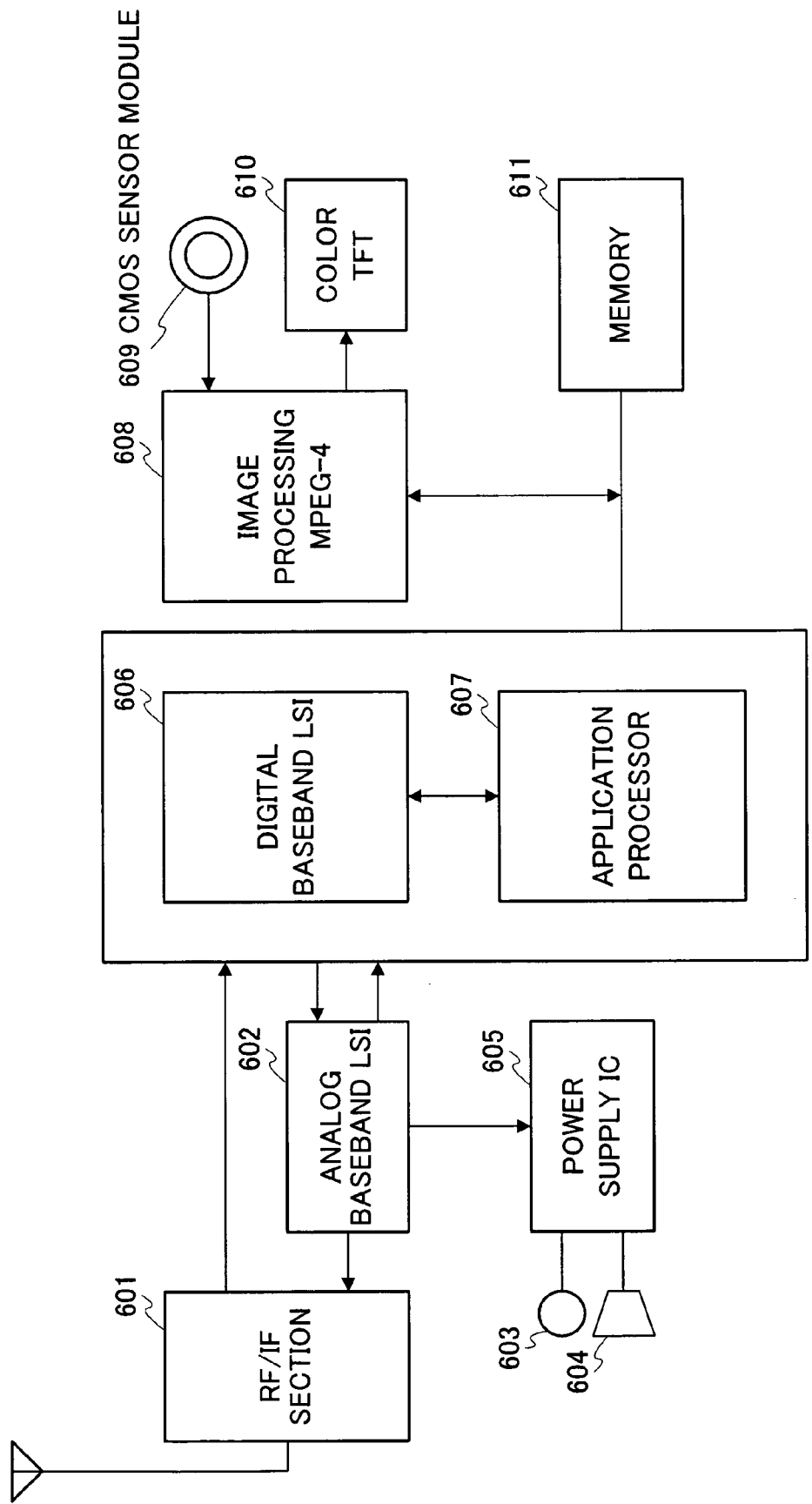
FIG. 16 is a view showing an example of an electronic circuit mounted with the semiconductor integrated circuit of the first or second embodiment of the present invention.

FIG. 16 is a view showing an example of an electronic circuit mounted with the semiconductor integrated circuit of the first or second embodiment of the present invention. The electronic circuit shown in FIG. 16 shows an example of system blocks for a mobile telephone with a camera having an MPEG moving picture processing function. The electronic circuit shown in FIG. 16 is composed of an RF/IF (Radio Frequency/Intermediate Frequency) section 601, an analog baseband LSI 602, a microphone 603, a speaker 604, a power supply IC (Integrated Circuit) 605, a digital baseband LSI 606, an application processor 607, a companion LSI (moving picture processor MPEG-4) 608 for MPEG 4 moving picture processing, a CMOS (Complementary Metal Oxide Semiconductor) sensor module 609, a color TFT (Thin Film Transistor) 610, and memory 611 consisting of flash memory and SRAM (Static Random Access Memory) etc.

In recent years, the extent of LSI integration has increased, and is moving in the direction of incorporating the digital baseband LSI 606, the application processor 607 and the companion LSI 608 for MPEG4 moving picture processing on a single chip. A mobile telephone with a camera having an MPEG moving picture processing function such as shown in FIG. 16 where the digital baseband LSI 606, application processor 607, and companion LSI 608 for MPEG4 moving picture processing are incorporated on a single-chip LSI is applicable as electronic equipment mounted with the low power consumption semiconductor integrated circuit shown in either of the first and second embodiments.

The semiconductor integrated circuit of the preferred embodiments of the present invention is effective in reducing the number of power supply wires and in reducing power consumption, and is effective in lowering the power consumption of large-scale semiconductor integrated circuits (system LSI's) where a variety of functions are mounted on a single chip.

The present invention is not limited to the above described embodiments, and various variations and modifications may be possible without departing from the scope of the present invention.

This application is based on Japanese Patent Application No. 2005-71520, filed on Mar. 14, 2005, the entire content of which is expressly incorporated by reference herein.

What is claimed is:

1. An SOI (Silicon On Insulator) structure semiconductor integrated circuit with a plurality of circuit blocks composed of P-channel elements and N-channel elements, comprising:
   a first circuit block not including a critical path;
   a second circuit block including a critical path;
   first power supply wiring providing a first power supply;
   second power supply wiring supplying a second power supply of a high voltage compared to the first power supply;
   P-channel first substrate power supply wiring supplying the first power supply from the first power supply wiring as a substrate power supply for P-channel elements of the first circuit block;
   P-channel first power supply wiring supplying the first power supply from the first power supply wiring as a source power supply for P-channel elements of the first circuit block;
   P-channel second substrate power supply wiring supplying the first power supply from the first power supply wiring as a substrate power supply for P-channel elements of the second circuit block; and
   P-channel second power supply wiring supplying the second power supply from the second power supply wiring as a source power supply for P-channel elements of the second circuit block.

2. The semiconductor integrated circuit of claim 1, further comprising:
   a third circuit block including a critical path;
   third power supply wiring supplying a third power supply of a high voltage compared with the second power supply;
   P-channel third substrate power supply wiring supplying the first power supply from the first power supply wiring as a substrate power supply for P-channel elements of the third circuit block; and
   P-channel second power supply wiring supplying the third power supply from the third power supply wiring as a source power supply for P-channel elements of the third circuit block.

3. The semiconductor integrated circuit of claim 1, wherein the power supply voltage of the power supply wiring supplying a source power supply to P-channel elements of circuit blocks other than the first circuit block is set to ground potential at the time of standby.

4. The semiconductor integrated circuit of claim 1, further comprising:
   reference power supply wiring providing a reference power supply;

substrate power supply wiring supplying a substrate power supply of a higher voltage than the reference power supply;

N-channel first substrate power supply wiring supplying the reference power supply from the reference power supply wiring as a substrate power supply for N-channel elements of the first circuit block;

N-channel first reference power supply wiring supplying the reference power supply from the reference power supply wiring as a source power supply for N-channel elements of the first circuit block;

N-channel second substrate power supply wiring supplying the substrate power supply from the substrate power supply wiring as a substrate power supply for N-channel elements of the second circuit block; and N-channel second reference power supply wiring supplying the reference power supply from the reference power supply wiring as a source power supply for N-channel elements of the second circuit block.

5. The semiconductor integrated circuit of claim 1, further comprising:

N-channel third substrate power supply wiring supplying the first power supply from the first power supply wiring as a substrate power supply for N-channel elements of the third circuit block; and N-channel third reference power supply wiring supplying the reference power supply from the reference power supply wiring as a source power supply for N-channel elements of the third circuit block.

6. The semiconductor integrated circuit of claim 1, wherein power supply voltages of P-channel substrate power supplies other than the first circuit block and power supply voltages of P-channel source power supplies are made to be equal and power supply voltages of N-channel substrate power supplies other than for the first circuit block and power supply voltages of N-channel source power supplies are made to be equal at the time of standby.

7. The semiconductor integrated circuit of claim 1, wherein a level shifter is provided between the first circuit block and the second circuit block or the third circuit block.

8. The semiconductor integrated circuit of claim 1, further comprising: a circuit incorporating the first circuit block, the second circuit block, and the third circuit block respectively, wherein a power supply voltage for the circuit incorporating the first circuit block is low compared with power supply voltages for circuits incorporating other circuit blocks.

9. The semiconductor integrated circuit of claim 1, wherein a threshold voltage of the circuit incorporating the first circuit block is high compared to a threshold voltage of circuits incorporating other circuit blocks.

10. The semiconductor integrated circuit of claim 1, wherein the second circuit block is put into a standby state by stopping a system clock supplied to the second circuit block, and cutting the power supply voltage of the second power supply wiring supplied to the second circuit block so as to set ground potential.

11. The semiconductor integrated circuit of claim 1, wherein it is possible to return the second circuit block from a standby state by changing the power supply voltage of the second power supply wiring supplied to the second circuit block in a standby state from ground potential to the voltage value of the second power supply during operation so as to re-apply a system clock supplied to the second circuit block.

12. The semiconductor integrated circuit of claim 1, wherein the semiconductor integrated circuit has a partially-depleted SOI structure.

* * * * *